(12) United States Patent
Wong

(10) Patent No.: US 6,265,926 B1
(45) Date of Patent: Jul. 24, 2001

(54) PROGRAMMABLE PCI OVERVOLTAGE INPUT CLAMP

(75) Inventor: Wilson Wong, San Francisco, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/318,486

(22) Filed: May 25, 1999

Related U.S. Application Data
(60) Provisional application No. 60/086,866, filed on May 27, 1998.

(51) Int. Cl.[7] .............................................. H03K 19/0175
(52) U.S. Cl. ........................ 327/318; 327/309; 327/319; 327/333; 326/81; 326/83
(58) Field of Search ................................. 327/309, 315, 327/331, 333, 318, 319, 320, 321, 322, 327, 328, 108, 112; 326/81, 82, 83, 62, 63, 68

(56) References Cited

U.S. PATENT DOCUMENTS

| | | | |
|---|---|---|---|
| 4,617,479 | 10/1986 | Hartmann et al. | 365/185.17 |
| 4,871,930 | 10/1989 | Wong et al. | 326/39 |
| 5,151,619 | 9/1992 | Austin et al. | 326/86 |
| 5,241,224 | 8/1993 | Pedersen et al. | 326/41 |
| 5,258,668 | 11/1993 | Cliff et al. | 326/41 |
| 5,260,610 | 11/1993 | Pedersen et al. | 326/41 |
| 5,260,611 | 11/1993 | Cliff et al. | 326/39 |
| 5,300,835 | 4/1994 | Assar et al. | 326/68 |
| 5,381,062 | 1/1995 | Morris | 326/68 |
| 5,396,128 | 3/1995 | Dunning et al. | 326/68 |
| 5,436,575 | 7/1995 | Pedersen et al. | 326/40 |
| 5,444,397 | 8/1995 | Wong et al. | 326/81 |
| 5,450,025 | 9/1995 | Shay | 326/81 |
| 5,451,889 | 9/1995 | Heim et al. | 326/81 |
| 5,453,705 | 9/1995 | Atallah et al. | 326/86 |
| 5,467,031 | 11/1995 | Nguyen et al. | 326/81 |
| 5,488,326 | 1/1996 | Shiraishi et al. | 327/408 |
| 5,530,392 | 6/1996 | Runas et al. | 327/333 |
| 5,543,733 | * 8/1996 | Mattos et al. | 326/81 |
| 5,546,019 | 8/1996 | Liao | 326/81 |
| 5,570,043 | 10/1996 | Churchill | 326/81 |
| 5,576,635 | 11/1996 | Partovi et al. | 326/27 |
| 5,629,634 | 5/1997 | Carl et al. | 326/27 |

(List continued on next page.)

OTHER PUBLICATIONS

U.S. application No. 08/863,886, Patel et al., filed May 27, 1997.
U.S. application No. 09/057,361, Turner, filed Apr. 8, 1998.
Alfke, P., "Low–Voltage FPGAs Allow 3.3–V/5–V System Design," *Electronic Design*, pp. 70–76(even) (Aug. 18, 1997).
Xilinx, "I/O Characteristics of the 'XL FPGAs," Application Note XAPP 088 (Nov. 12, 1997).

*Primary Examiner*—Tuan T. Lam
(74) *Attorney, Agent, or Firm*—Morrison & Foerster LLP

(57) ABSTRACT

An input/output (I/O) circuit is provided for selectively sinking current from an I/O pin. The I/O circuit includes: an output driver; a well bias circuit coupled to the I/O pin, the output driver, and an internal supply voltage; and a voltage clamping circuit coupled to the I/O pin and the output driver, the voltage clamping circuit selectively sinking current from the I/O pin to a voltage potential other than the internal supply voltage. In a presently preferred embodiment, the voltage clamping circuit includes: a first switch coupled to the I/O pin and to ground potential; a second switch coupled to the first switch and the I/O pin; a third switch coupled to the first switch and the I/O pin; a voltage divider coupled to the third switch; and a resistor coupled to the first switch and the third switch; where the first switch includes an n-channel transistor, the second switch includes an n-channel transistor, and the third switch includes a p-channel transistor and where when the first switch, the second switch and the third switch are ON, current is sunk from the I/O pin to ground potential.

39 Claims, 4 Drawing Sheets

U.S. PATENT DOCUMENTS

| | | | |
|---|---|---|---|
| 5,631,579 | 5/1997 | Miki et al. | 326/58 |
| 5,635,860 * | 6/1997 | Westerwick | 326/81 |
| 5,635,861 | 6/1997 | Chan et al. | 326/81 |
| 5,644,265 | 7/1997 | Austin et al. | 327/333 |
| 5,646,548 | 7/1997 | Yao et al. | 326/80 |
| 5,646,550 | 7/1997 | Campbell, Jr. et al. | 326/81 |
| 5,661,414 | 8/1997 | Shigehara et al. | 326/81 |
| 5,825,206 * | 10/1998 | Krishnamurthy et al. | 326/81 |
| 5,844,425 * | 12/1998 | Nguyen et al. | 326/58 |
| 6,028,450 * | 2/2000 | Nance | 326/81 |

* cited by examiner

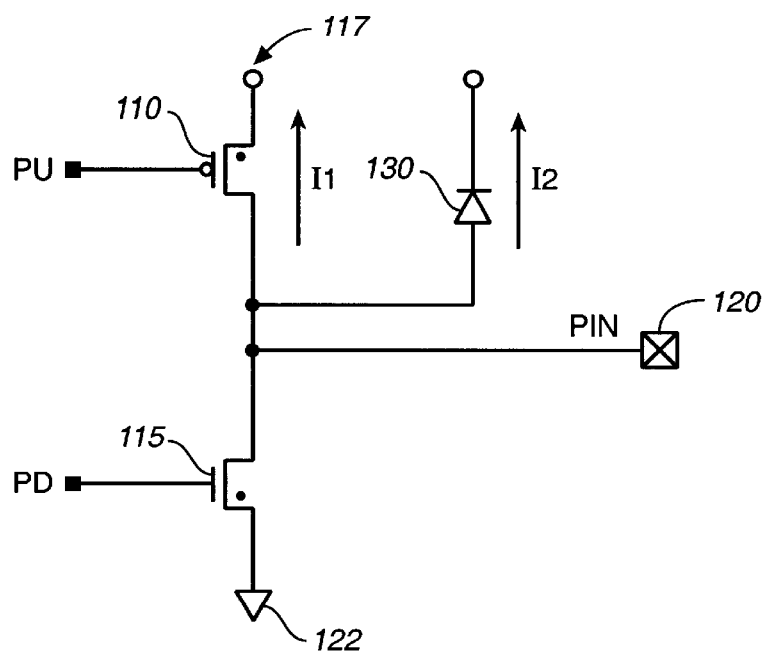
FIG._1
*(PRIOR ART)*
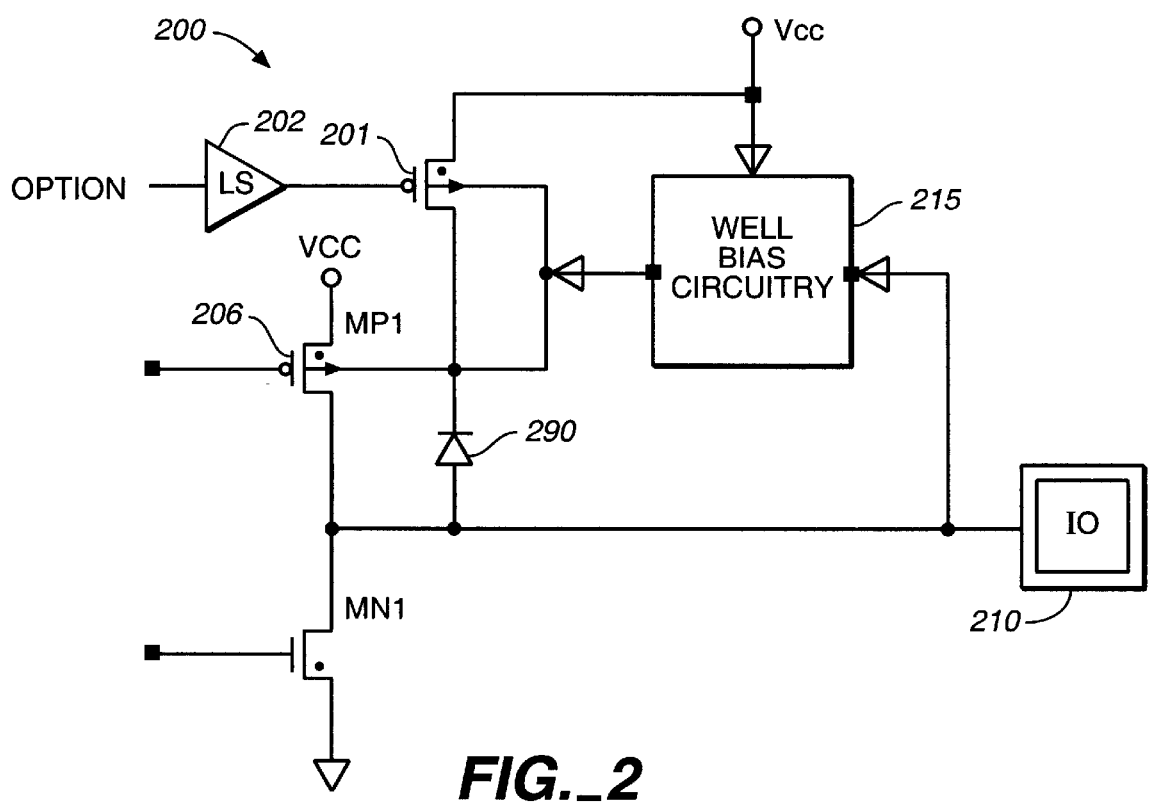
FIG._2

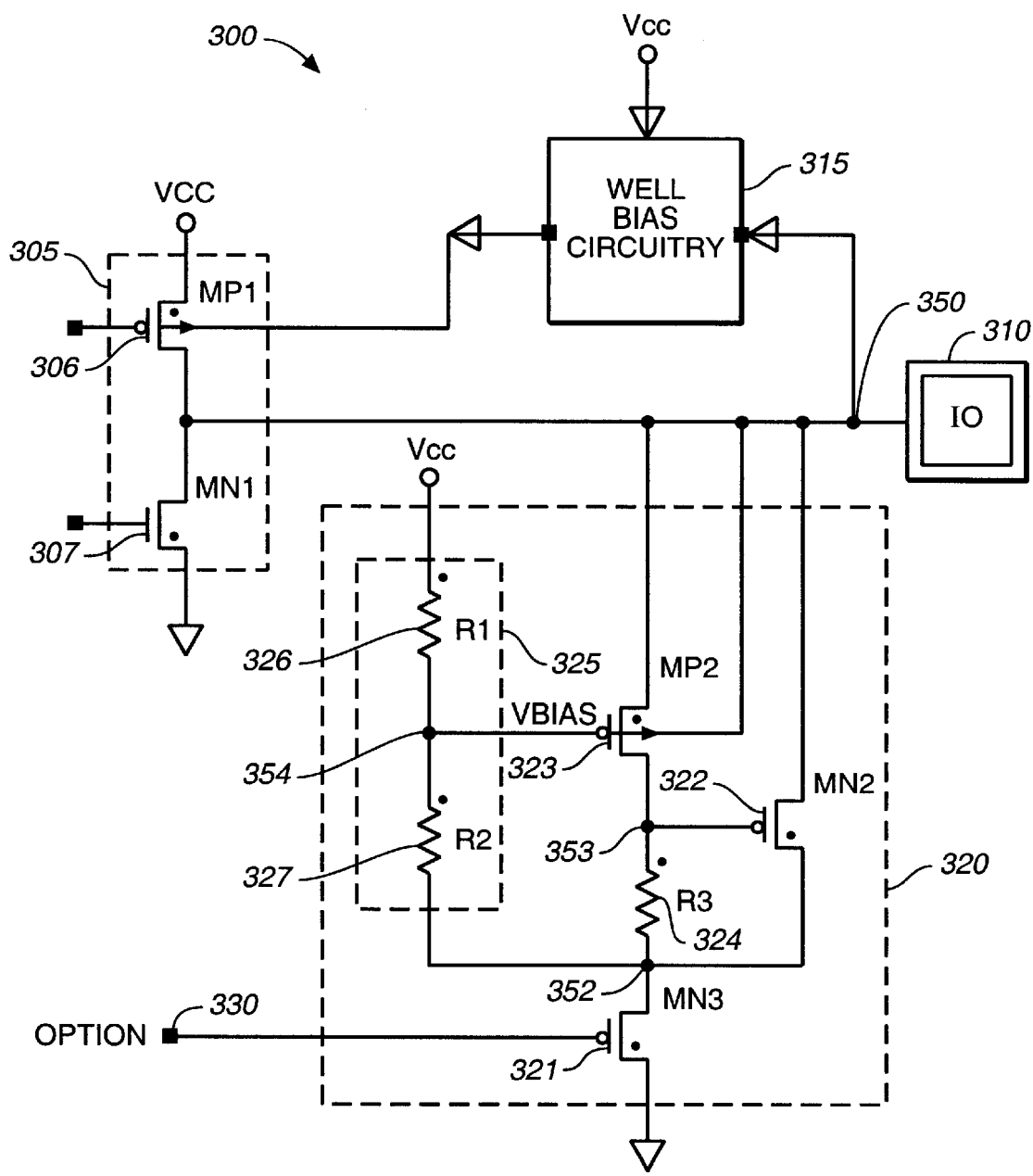
FIG._3

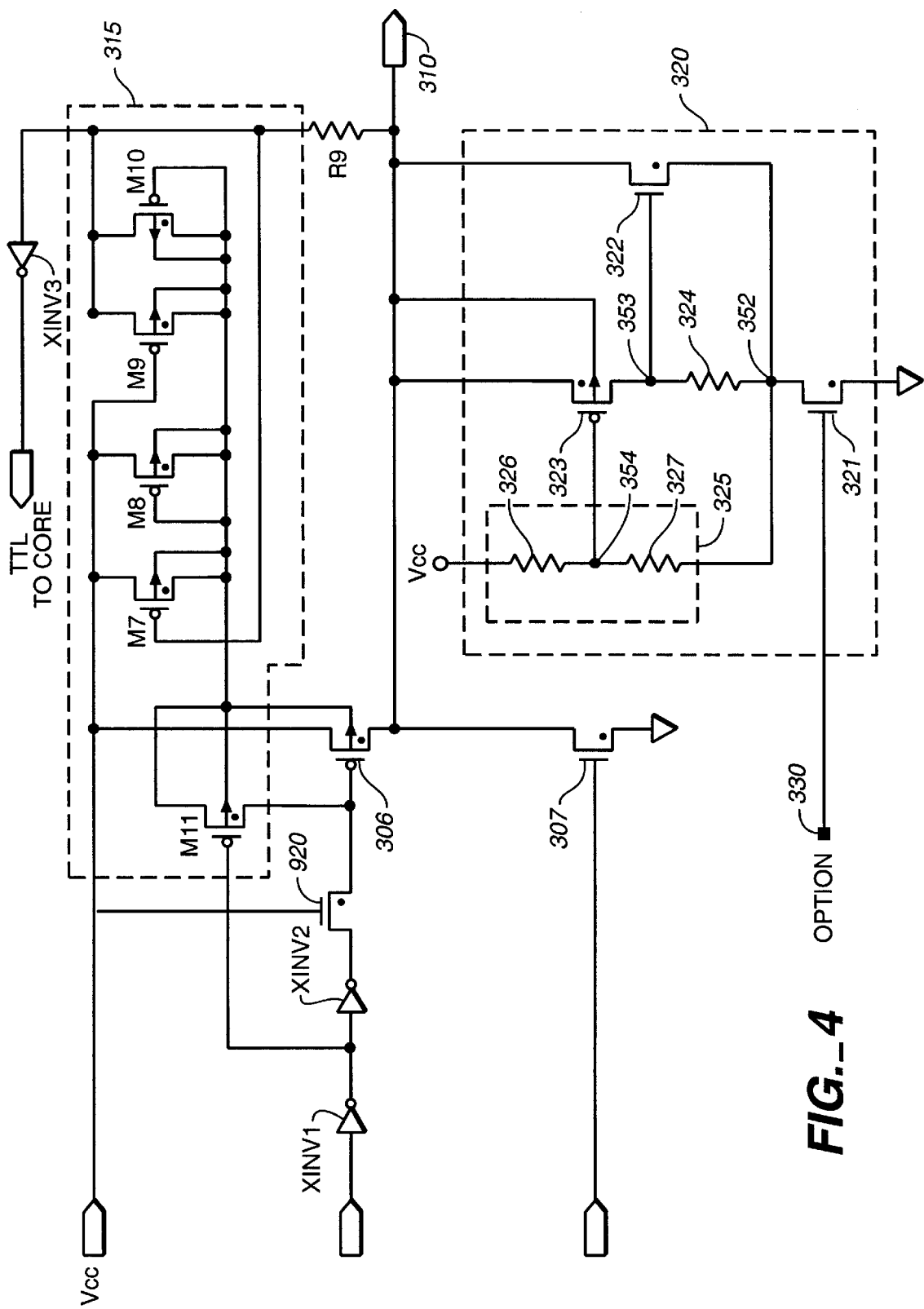
FIG._4

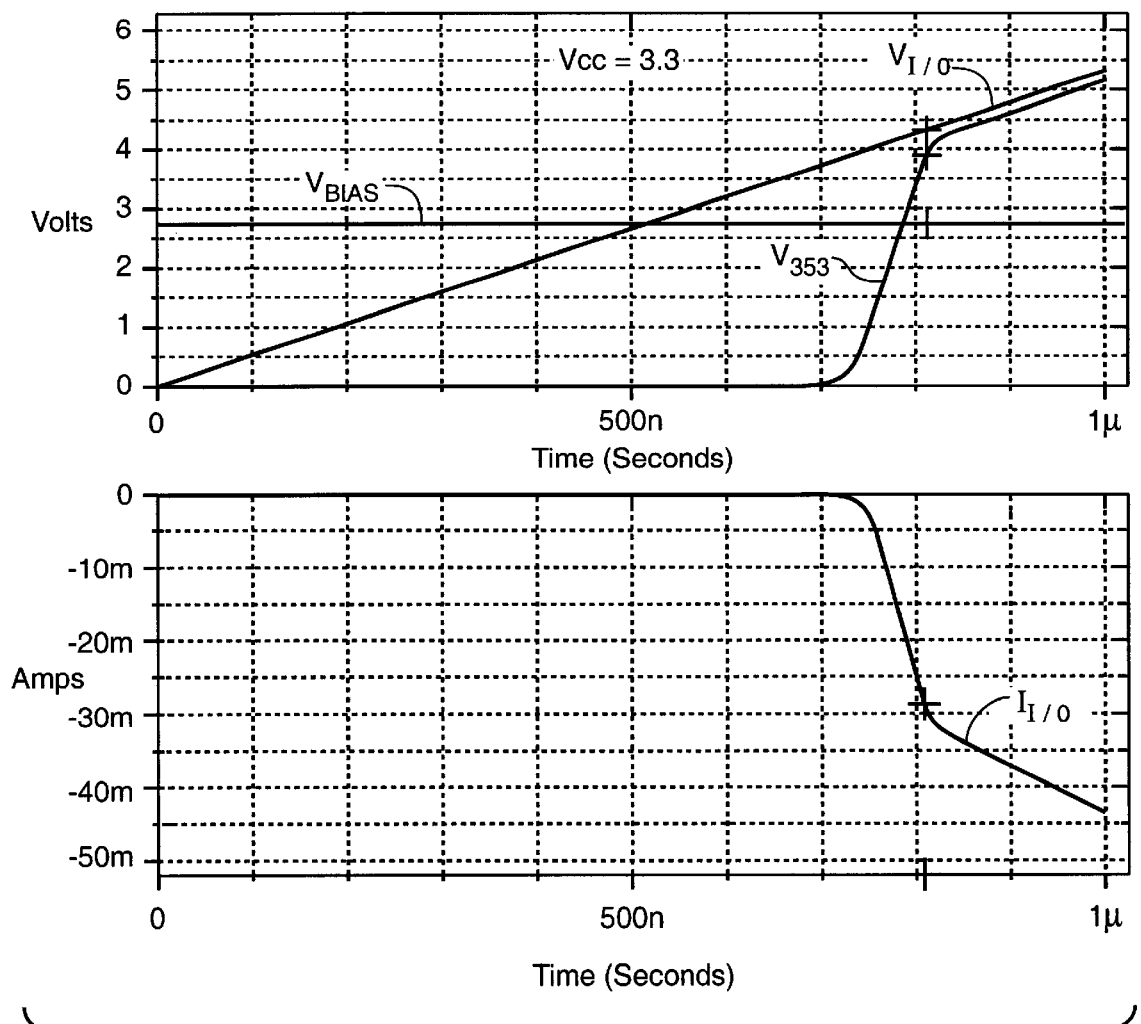
*FIG._5A*
*FIG._5B*

PROGRAMMABLE PCI OVERVOLTAGE INPUT CLAMP

CROSS-REFERENCE TO RELATED APPLICATIONS

This application claims the benefit of U.S. Provisional Application Ser. No. 60/086,866, filed May 27, 1998, and entitled "Programmable PCI Overvoltage Input Clamp".

BACKGROUND OF THE INVENTION

1. Field of the Invention

This invention relates generally to integrated circuits and, in particular, to input/output circuits of integrated circuits.

2. Description of the Related Art

Input/output ("I/O") circuits are used to input electronic signals to and output electronic signals from integrated circuits. A typical integrated circuit ("IC") includes an integral I/O circuit for each of its externally accessible I/O pins. An I/O circuit usually includes a driver circuit which receives signals from the IC and outputs them to the I/O pin. The driver circuit may also herein be referred to as the output driver. It also generally includes an input buffer which receives signals from the I/O pin and inputs them to the IC. A typical I/O circuit also includes an enable circuit which can place the driver circuit in either a high impedance state in which signals can be input to the IC via the I/O pin, or in an output enabled state in which signals can be output from the IC via the I/O pin.

I/O circuits transfer signals to and from integrated circuit devices in a variety of types of electronic systems. For instance, I/O circuits may be used to interconnect integrated circuits to a shared system bus so that multiple ICs connected to the bus can communicate with each other. In many electronic systems all of the integrated circuits connected to a system bus operate at the same supply voltage level. However, as the dimensions of the circuits in ICs have decreased, the supply voltages employed by ICs also have decreased. As a result, there has been a proliferation of mixed signal systems in which some ICs connected to a system bus operate at a higher supply voltage (e.g., 5-volts), and other ICs connected to the same system bus operate at a lower supply voltage (e.g., 3.3-volts).

A problem with mixed signal systems has been the occurrence of leakage currents, over the system bus, from an IC operating at a higher supply voltage to an IC operating at a lower supply voltage. For instance, an IC operating with a 3.3 volt supply may experience an overvoltage when an IC connected to the same bus as the 3.3 volt device drives a 5 volt signal onto the bus. An IC may experience an overvoltage, for example, when the voltage on one of its I/O pins is greater than the IC's internal supply voltage. As used herein, an IC's internal voltage includes both core and peripheral supply voltages, which may have the same or different values. Thus, leakage current may result when an output level high signal is imparted from one IC onto an I/O pin of another IC operating at a lower supply voltage.

The illustrative drawing of FIG. 1 shows a pull-up/pull-down driver circuit which will be used to explain such leakage currents. The driver circuit includes a pull-up driver 110 and a pull-down driver 115. In this example, pull-up driver 110 is a p-channel (PMOS) transistor, and pull-down driver 115 is an n-channel (NMOS) transistor. Pull-up driver 110 is coupled between a supply voltage 117 and a pin (or pad) 120. Pin 120 is referred to as an I/O pin as it may be used for input or output, or both. Pull-down driver 115 is coupled between pin 120 and a supply voltage 122. Supply 117 is typically $V_{DD}$ or $V_{CC}$, each of which may be referred to as the internal supply voltage or drive voltage, and supply 122 is typically $V_{SS}$, which is typically at a low voltage, such as ground potential.

In operation, the output buffer will generate a logic high, logic low, or be tristated (i.e., high impedance state) depending on the logic signals at PU and PD. PU is provided to a gate of pull-up driver 110, and PD is provided to a gate of pull-down driver 115. When PU is a low and PD is a low, the pull-up drive 110 is ON and the pull-down driver 115 is OFF, and the pin will be driven high (to the level of $V_{CC}$). When PU is high and PD is high, the pull-up driver 110 is OFF and the pull-down driver 115 is ON, and the pin will be driven low (to the level of $V_{SS}$). When PU is high and PD is low, both the pull-up driver 110 and the pull-down driver 115 are OFF, and the pin 120 will be tristated. Pin 120 is typically also coupled to an input buffer (not shown) for the inputting of logical signals into the integrated circuit and the core. Pin 120 may be used as an input when the output buffer is placed in tristate, or may also be used to feed back signals from the output buffer into the integrated circuit.

However, the driver circuit shown in FIG. 1 is not tolerant to high voltages, and may not be useful in the case where input voltages are imparted by an integrated circuit having a supply voltage above a level of the first supply voltage 117. For example, when the output buffer is tristated, signals are input to the input buffer (not shown) via pin 120. If first supply 117 is 3.3 volts, then when interfacing a 5-volt integrated circuit, pin 120 may potentially be at 5 volts or above. A 5-volt input would represent a logic high input. This voltage may even go above 5 volts during transitions due to overshoots. This poses potential problems.

An I1 current sneak path (or leakage path) may occur when the VPIN (the voltage level at the pin) goes above 3.3 volts+|VTP110|. VTP110 is the threshold voltage of pull-up driver 110. Furthermore, in an embodiment, pull-up driver 110 is a PMOS transistor and formed in an n-well on a p-type substrate. In that case, there may be a parasitic diode 130 between pin 120 and first supply 117. Parasitic diode 130 represents the diode between the p-diffusion used to form the drain and the n-well region, which is connected to the first supply voltage 117. Therefore, an I2 current sneak path will also occur when the VPIN goes above 3.3 volts+Vdiode. Vdiode is the turn-on or forward voltage (VF) of the diode.

Leakage current paths I1 and I2 represent a DC (direct current) path which can cause the first supply ($V_{CC}$) to rise. If $V_{CC}$ rises above maximum allowable levels and remains at those levels for longer than an acceptable time, the device, as well as other devices connected to $V_{CC}$, may have oxide reliability issues. One solution to the problem of leakage currents in mixed signal systems is to provide voltage overshoot protection that blocks the flow of leakage current in overshoot situations.

Some examples of solutions to current leakage problems resulting from voltage overshoot on I/O pins are proposed in the following patents: U.S. Pat. No. 5,151,619, entitled, "CMOS Off Chip Driver Circuit", issued to Austin, et al.; U.S. Pat. No. 5,450,025, entitled, "Tristate Buffer For Interfacing to a Bus Subject to Overvoltage Conditions", issued to Shay; U.S. Pat. No. 5,396,128, entitled, "Output Circuit For Interfacing Integrated Circuits Having Different Power Supply Potentials", issued to Dunning, et al.; U.S. Pat. No. 5,467,031, entitled, "3.3 Volt CMOS Tri-State Driver Circuit Capable of Driving Common 5 Volt Line", issued to Nguyen, et al.; and U.S. Pat. No. 5,546,019, entitled, "CMOS I/O Circuit With 3.3 Volt Output And Tolerance of 5 Volt Input", issued to Liao. Another example of an overvoltage-tolerant I/O circuit is disclosed in U.S. patent application Ser. No. 08/863,886, filed May 27, 1997, and entitled Overvoltage-Tolerant Interface For Integrated Circuit, which is assigned to the assignee of the present invention and is incorporated herein by reference.

Thus, in a mixed signal systems it is desirable to have I/O pins that tolerate voltages that are higher than the internal supply voltage. For example, if the internal supply is at 3.3 volts, it is desirable to have I/O pins that tolerate 5 volt inputs. In other words, it is desirable to have I/O pins that accept a 5 volt input while also avoiding leakage currents.

Some applications may, on the other hand, require sinking a certain amount of current when the I/O pin voltage exceeds some limit. For example, in Peripheral Component Interconnect (PCI) compliant systems, an I/O pin may be required to provide a clamping current greater than 20 milliamperes (mA) when the I/O pin voltage is 1 volt or more above the internal supply voltage. A purpose of this requirement, for example, is to sink current in order to quickly dissipate ringing voltage overshoot excursions on an I/O pin.

From a practical standpoint, it is desirable for ICs to be built to be useable in either a mixed signal system or a PCI system or in both simultaneously, for example. Unfortunately, as explained above, the performance requirements of these different systems often may be at odds with each other. Specifically, an I/O circuit in a typical mixed signal system blocks the current flow in overvoltage situations. In contrast, an I/O circuit in a PCI compliant system must conduct (or sink) current from an I/O pin in overvoltage situations.

An earlier solution to these conflicting requirements was to add individual internal diodes with anodes connected to the I/O pins and with cathodes connected to an internal Vtt rail. This solution is described in, "Low-Voltage FPGAs Allow 3.3-V/5-V System Design", Electronic Design, Aug. 18, 1997, by Peter Alfke; and Application Note, XAPP 088, Nov. 12, 1997 (Version 1.0), by Xilinx, Inc, San Jose, Calif. This internal Vtt rail is internally connected to multiple I/O pins. For PCI compliance, this Vtt rail is connected externally to the appropriate supply voltage, 5 volts or 3.3 volts, for example. For mixed signal tolerant systems, the Vtt rail is left unconnected or floating.

There are shortcomings with this solution. Since multiple I/O pins all are internally connected to the Vtt rail, eight in the reference documents identified above, these I/O pins cannot be configured individually to operate in PCI compatible mode or a mixed signal tolerant mode. Rather, they are configured collectively, or as a group. Moreover, the actual process of configuring the multiple I/O pins involves externally connecting the Vtt rail for PCI system operation or leaving it unconnected for mixed signal system operation. Connecting the Vtt rail or leaving it unconnected typically involves printed circuit board (PCB) level design decisions which may be difficult to change if there is a change in the plans for I/O pin usage later in an overall system design process.

FIG. 2 is a schematic diagram of another earlier system for dealing with the dual requirements of overvoltage tolerance and clamping voltages. The I/O circuit of FIG. 2 is described in more detail in U.S. patent application Ser. No. 09/057,361, filed Apr. 8, 1998, and entitled Integrated Circuit With Both Clamp Protection And High Impedance Protection From Input Overshoot, which is assigned to the assignee of the present invention and is incorporated herein by reference.

In FIG. 2, depending on the state of transistor 201, which is a large p-channel (PMOS) transistor, I/O circuit 200 may be overvoltage tolerant or clamp the voltage at I/O pin 210. When transistor 201 is ON, the well of pull-up transistor 206 is shorted to the internal supply voltage $V_{CC}$ and the voltage at I/O pin 210 is clamped so as not to exceed $V_{CC}+|VTP206|$. $|VTP206|$ is the absolute value of the threshold voltage of pull-up transistor 206. On the other hand, when the transistor 201 is OFF, the I/O circuit 200 is overvoltage tolerant and the voltage at the well of pull-up transistor 206 is the higher of the internal supply voltage $V_{CC}$ or the I/O pin voltage.

If I/O circuit 200 is to be overvoltage tolerant, then lever shifter (LS) 202 is caused to produce a high output. The high output of LS 202 causes transistor 201 to be OFF. When transistor 201 is OFF, the well bias circuitry 215 biases the well of the pull-up transistor 206 to the higher of the internal supply voltage $V_{CC}$ or the I/O pin voltage. Consequently, when the I/O pin voltage is higher than the internal supply voltage $V_{CC}$, then the well of the pull-up transistor 206 is biased to the I/O pin voltage. Thus, the well bias circuitry 215 makes I/O circuit 200 overvoltage tolerant.

If it is desired to clamp the I/O pin voltage, then LS 202 is caused to produce a low output. The low output of LS 202 causes transistor 201 to turn ON. This in turn causes the well of the pull-up transistor 206 to be shorted to the internal supply voltage $V_{CC}$. Thus, transistor 206 acts as a well clamping transistor. The clamping current for clamping the well of the pull-up transistor 206 to the internal supply voltage $V_{CC}$ is provided by the well of the pull-up transistor 206 and diode 290. The clamping current is then sunk via transistor 201 and diode 290 at the internal voltage supply $V_{CC}$.

Although the I/O circuit 200 provides both overvoltage tolerance and voltage clamping, it has some features that may not be desirable in some circumstances. First, both transistor 201 and LS 202 are rather large. Second, forward biasing of diode 290 requires greater latch-up precaution than would otherwise be needed. The latch-up precautions include use of guard rings and increasing the spacing of transistors in the I/O circuit. These result in an increase in the size of the I/O circuit 200 and the IC of which it is a part. Third, the clamping current is sunk to the internal voltage supply $V_{CC}$. If the internal voltage supply $V_{CC}$ is weak, then when several I/O circuits sink their clamping currents into the internal voltage supply $V_{CC}$, the internal voltage supply $V_{CC}$ may drift to a higher voltage. If the internal supply voltage $V_{CC}$ rises above maximum allowable levels and remains at those levels for longer than an acceptable time, then the internal transistors of the IC may be stressed more and the IC may have oxide reliability issues.

As a result, there has been a need for integrated circuits with I/O circuitry that meets the aforementioned dual requirements while avoiding the above-mentioned shortcomings of the earlier systems. The present invention meets this need.

SUMMARY OF THE INVENTION

The present invention encompasses an input/output (I/O) circuit for selectively sinking current from an I/O pin, the I/O circuit comprising: an output driver; a well bias circuit coupled to the I/O pin, the output driver, and an internal supply voltage; and a voltage clamping circuit coupled to the I/O pin and the output driver, the voltage clamping circuit selectively sinking current from the I/O pin to a voltage potential other than the internal supply voltage.

In a presently preferred embodiment of the invention, the I/O circuit comprises: an output driver; a well bias circuit coupled to the I/O pin, the output driver, and an internal voltage supply; and a voltage clamping circuit coupled to the I/O pin, the output driver, and to ground potential, wherein the voltage clamping circuit comprises: a first switch coupled to the I/O pin and to ground potential; a second switch coupled to the first switch and the I/O pin; a third switch coupled to the first switch and the I/O pin; a voltage divider coupled to the third switch; and a resistor coupled to the first switch and the third switch; further wherein when the first switch, the second switch and the third switch are ON, current is sunk from the I/O pin to ground potential. In one presently preferred embodiment, the first switch comprises an n-channel transistor, the second switch comprises an n-channel transistor, and the third switch comprises a p-channel transistor.

The present invention is explained in more detail below with reference to the drawings.

BRIEF DESCRIPTION OF THE DRAWINGS

FIG. 1 is a circuit diagram of a conventional pull-up/pull-down driver circuit.

FIG. 2 is a circuit diagram of an earlier I/O circuit.

FIG. 3 is a circuit diagram of the presently preferred embodiment of the invention.

FIG. 4 is a more detailed circuit diagram of the presently preferred embodiment of the invention shown in FIG. 3.

FIG. 5A is a graph of some examples of voltages and currents in an embodiment of the I/O circuit of the present invention.

FIG. 5B is a table of values corresponding to the graphs of FIG. 5A when the voltage $V_{I/O}$ is equal to 4.297 volts.

DETAILED DESCRIPTION OF THE PREFERRED EMBODIMENT

The present invention comprises an IC with a novel I/O circuitry that is programmable to provide overvoltage tolerance or clamping of the I/O pin voltage. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

FIG. 3 is a circuit diagram of the presently preferred embodiment of the invention. In FIG. 3, I/O circuit 300 comprises an output driver 305, an I/O pin 310, a well bias circuitry 315, and a voltage clamping circuit 320, which may also herein be referred to as current sinking circuit 320. Output driver 305 includes pull-up driver 306, which is a p-channel (PMOS) transistor, and a pull-down driver 307, which is an n-channel (NMOS) transistor. The transistor 306 is coupled to the internal supply voltage $V_{CC}$, the well bias circuitry 315, the I/O pin 310 and transistor 307. The internal supply voltage $V_{CC}$ is also herein referred to as the drive voltage. The transistor 307 is coupled to transistor 306, the I/O pin 310, and ground potential.

The well bias circuitry 315 is shown in more detail in FIG. 4. Moreover, U.S. patent application Ser. No. 09/057,361, filed Apr. 8, 1998, entitled Integrated Circuit With Both Clamp Protection And High Impedance Protection From Input Overshoot, and U.S. patent application Ser. No. 08/863,886, filed May 27, 1997, entitled Overvoltage-Tolerant Interface For Integrated Circuits, both of which are assigned to the assignee of the present invention and are incorporated herein by reference, provide greater details regarding the well bias circuitry 315. Well bias circuitry 315 is coupled to the well of transistor 306, internal supply voltage $V_{CC}$, and node 350. Node 350 is coupled to the I/O pin 310, the voltage clamping circuit 320, transistor 306 and transistor 307.

The voltage clamping circuit 320 includes transistors 321, 322, and 323, resistor 324, and voltage divider 325. In a presently preferred embodiment, transistor 321 is an n-channel (NMOS) transistor. Also in a presently preferred embodiment, transistors 322 and 323 are n-channel and p-channel (PMOS) transistors, respectively. The gate of transistor 321 is coupled to option pin 330. Transistor 321 is also coupled to ground and node 352. Node 352 is coupled to resistor 324, voltage divider 325, transistor 321 and transistor 322. Resistor 324 is also coupled to node 353. Node 353 is coupled to transistor 323 and the gate of transistor 322. Transistor 322 is also coupled to node 350. Similarly, transistor 323 is coupled to node 350. Voltage divider 325 includes resistors 326 and 327 and is coupled to the internal supply voltage $V_{CC}$ and node 352. Resistors 326 and 327 are coupled at node 354, which is coupled to the gate of transistor 323.

If the user wants the I/O circuit 300 to be overvoltage tolerant, then the voltage at option pin 330 is set to low. As a result, transistor 321 is OFF. When transistor 321 is OFF, there is no current path from the I/O pin 310 to ground through the voltage clamping circuit 320. Consequently, the voltage clamping circuit 320 does not clamp the voltage at I/O pin 310. The voltage clamping circuit is effectively disabled and the well bias circuitry 315 provides overvoltage protection as explained in the above-referenced U.S. Patent Applications (more specifically, U.S. patent application Ser. No. 09/057,361, filed Apr. 8, 1998, entitled Integrated Circuit With Both Clamp Protection And High Impedance Protection From Input Overshoot, and U.S. patent application Ser. No. 08/863,886, filed May 27, 1997, and entitled Overvoltage-Tolerant Interface For Integrated Circuits.)

If on the other hand, the user wants the I/O circuit 300 to clamp the voltage of the I/O pin 300 by sinking current therefrom, then the voltage at option pin 330 is set high. As a result of the high voltage at option pin 330, transistor 321 is turned ON. When transistor 321 is ON, the voltage clamping circuit 320 is enabled to clamp the voltage of the I/O pin 310 by drawing current therefrom and sinking it to ground.

If the voltage at I/O pin 310 (which is equal to the voltage at node 350 as well as the source voltage of transistor 323) exceeds the gate voltage of transistor 323 by the threshold voltage of transistor 323 or more, then transistor 323 will also be ON. The gate voltage of transistor 323 is $V_{BIAS}$ and is equal to the voltage at node 354. It is to be noted that $V_{BIAS}$ may be used to bias the gates of other transistors 323 in other I/O circuits 300 which are part of the same IC as the I/O circuit 300 shown in FIG. 3. Preferably $V_{BIAS}$ is used to bias the gates of all transistors 323 of I/O circuits 300 which are part of the same IC as I/O circuit 300 shown in FIG. 3. When transistor 321 is ON, the voltage $V_{BIAS}$ is equal to ($V_{CC}$)×(resistance of resistor 327)/(resistance of resistor 326+ resistance of resistor 327). In a presently preferred embodiment, the resistances of resistors 326 and 327 are selected such $V_{BIAS}$ is approximately equal to $V_{CC}$. In other words, the resistance of resistor 327 is substantially greater than the resistance of resistor 326 such that the ratio of the resistance of resistor 327 to the sum of the resistances of resistors 326 and 327 is approximately equal to one. Therefore, in a presently preferred embodiment, when the voltage at the I/O pin 310 is greater than or equal to the sum of $V_{BIAS}$ and |VTP323|, where |VTP323| is the absolute value of the threshold voltage of the transistor 323, transistor 323 is ON.

One of the PCI requirements is that when the voltage at I/O pin is 1 or more volts greater than the $V_{CC}$, then more than 20 mA of current must be sunk from the I/O pin. Accordingly, the parameters of the voltage clamping circuit 320 are selected such that when transistor 321 is ON, transistor 323 is also ON when the voltage at I/O pin 310 is 1 volt or more greater than $V_{CC}$. In a presently preferred embodiment, when the voltage at the I/O pin 310 is 1 or more volts greater than $V_{CC}$ then more than 20 mA of current is sunk from the I/O pin 310 to ground.

When transistor 323 is turned ON, the voltage at node 353, which is equal to the gate voltage of transistor 322, rises. Eventually the voltage at node 353 rises to a threshold level for causing transistor 322 to turn ON (i.e., the turn-ON voltage of transistor 322).

The resistance of resistor 324 determines the voltage at node 353 as well as the time it takes for the voltage at node 353 to reach the turn-ON voltage of transistor 322. The voltage at node 353 is directly proportional to the resistance of resistor 324. In other words, an increase in the resistance of resistor 324 results in an increase in the voltage at node 353. Conversely, the time it takes for the voltage at node 353 to reach the turn-ON voltage of transistor 322 is inversely proportional to the resistance of resistor 324. In other words, an increase in the resistance of resistor 324 results in a decrease in the time it takes for the voltage at node 353 to reach the turn-ON voltage of transistor 322. Similarly, the transient response time of transistor 322 (i.e., the time it takes for transistor 322 to turn OFF after the voltage at node 353 drops below the turn-ON voltage of transistor 322) is directly proportional to the resistance of resistor 324. In other words, an increase in the resistance of resistor 324 results in an increase in the transient response time of transistor 322. The resistance of resistor 324 is selected to meet the particular parameter restrictions imposed on the circuit, such as turn-ON time and transient response time of transistor 322. Similarly, the size of transistor 323 is selected to provide the desired turn-ON time and transient response time for transistor 322.

When the voltage at I/O pin 310 is 1 volt or more greater than $V_{CC}$ and the input at option pin 330 is high so as to turn on transistor 321, then more than 20 mA of current is sunk from the I/O pin 310 to ground through transistors 321, 322, and 323. The bulk of the current sunk from the I/O pin 310 to ground is generated by transistors 321 and 322. As such, transistors 321 and 322 are sized so as to meet, in conjunction with transistor 323, the above-mentioned clamping current requirements of sinking currents of more than 20 mA from the I/O pin 310. This current sinking lowers the voltage at I/O pin 310 towards $V_{BIAS}$ plus |VTP323|.

Sinking current into ground rather than a voltage supply (such as $V_{CC}$) reduces the likelihood of causing an increase in the voltage at the voltage supply. As mentioned above, an increase in the voltage at the voltage supply may increase the stress on the internal transistors of the IC and cause oxide reliability issues. Thus, reducing the likelihood of causing an increase in the voltage at the voltage supply reduces the likelihood of increasing the stress on the internal transistors of the IC and also reduces the likelihood of oxide reliability issues. Moreover, as the current from I/O pin 310 is sunk to ground rather than $V_{CC}$ (as in the I/O circuit 200 of FIG. 2). It does not forward bias a diode (such as diode 290 in FIG. 2), the I/O circuit 300 does not require as much latch up precaution as does the I/O circuit 200 (shown in FIG. 2). This reduced latch up precaution also results in reducing the size of the I/O circuit 300 and the IC of which it is a part as latch up precautions typically involve use of guard rings and larger spacing of transistor devices, which increase the size of an I/O circuit and the IC circuit of which it is a part. An additional factor that makes I/O circuit 300 relatively small compared to I/O circuit 200 is the fact that transistors 321 and 322 are relatively small compared to transistor 201, LS 202, and diode 290 (shown in FIG. 2).

FIG. 5A is a graph of some examples of voltages and currents in the I/O circuit 300. More specifically, FIG. 5A shows an example of the voltage $V_{I/O}$ (the voltage at I/O pin 310), the voltage $V_{BIAS}$, the voltage $V_{353}$ (the voltage at node 353 which is also equal to the voltage at the gate of transistor 322), and the current $I_{I/O}$ (the clamping current sunk from I/O pin 310) versus time. As can be seen in FIG. 5A, when $V_{I/O}$ is approximately 4.3 volts (i.e., 1 volt greater than $V_{CC}$ which is equal to 3.3 volts), then the clamping current is approximately equal to 28 mA. More specifically, as shown in FIG. 5B, when the voltage $V_{I/O}$ is equal to 4.297 volts, current $I_{I/O}$ is equal to 27.06 mA. This meets the PCI specification of sinking more than 20 mA of current when the voltage at I/O pin 310 is 1 volt or more greater than $V_{CC}$. It is to be noted that, in FIG. 5A, $V_{I/O}$ is shown to rise to higher voltages even after it reaches 4.3 volts. This is because $V_{I/O}$ is forced to ramp up to higher voltages. Without such forcing, as a result of current sinking from the I/O pin 310, $V_{I/O}$ would be lowered towards $V_{BIAS}$ plus |VTP323|.

FIG. 5B is a table of values corresponding to the graphs of FIG. 5A when the voltage $V_{I/O}$ is equal to 4.297 volts. As shown in the table of FIG. 5B, when the voltage $V_{I/O}$ is equal to 4.297 volts, then the voltage $V_{353}$ is equal to 3.709, the voltage $V_{BIAS}$ is equal to 2.797 volts, the current $I_{I/O}$ is equal to 27.06 mA, the current $I_{VCC}$ (the current sunk from $V_{CC}$ to the voltage divider 325) is equal to 25.14 microamperes ($\mu$A), and the time is equal to 810.8 nanoseconds.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. An input/output (I/O) circuit for selectively sinking current from an I/O pin, the I/O circuit comprising:
   an output driver;
   a well bias circuit coupled to the I/O pin, the output driver, and an internal supply voltage; and
   a voltage clamping circuit coupled to the I/O pin and the output driver, said voltage clamping circuit selectively sinking current from the I/O pin to a voltage potential other than the internal supply voltage in response to an input from the I/O pin.

2. The I/O circuit of claim 1, wherein said voltage clamping circuit comprises an n-channel transistor which generates current sunk from the I/O pin.

3. The I/O circuit of claim 2, wherein the voltage potential is ground potential.

4. The I/O circuit of claim 1, wherein said voltage clamping circuit is coupled to ground potential, said voltage clamping circuit comprises a first switch coupled to the I/O pin and to ground potential such that when said first switch is ON, said voltage clamping circuit is enabled to sink current from the I/O pin to ground potential.

5. The I/O circuit of claim 4, wherein said voltage clamping circuit further comprises a second switch coupled to said first switch and the I/O pin.

6. The I/O circuit of claim 5, wherein said voltage clamping circuit further comprises a third switch coupled to said first switch and the I/O pin.

7. The I/O circuit of claim 6, wherein said voltage clamping circuit further comprises a voltage divider coupled to said third switch.

8. The I/O circuit of claim 7, wherein said voltage clamping circuit further comprises a resistor coupled to said first switch and said third switch.

9. The I/O circuit of claim 8, wherein said first switch comprises an n-channel transistor, said second switch comprises an n-channel transistor, and said third switch comprises a p-channel transistor.

10. The I/O circuit of claim 1, wherein the input from the I/O pin is voltage potential at the I/O pin.

11. The I/O circuit of claim 10 further wherein when the voltage potential at the I/O pin is 1 or more volts greater than the internal voltage supply potential, said voltage clamping circuit selectively sinks more than 20 milliamperes of current from the I/O pin to the voltage potential other than the internal supply voltage.

12. An input/output (I/O) circuit for selectively sinking current from an I/O pin, the I/O circuit comprising:
    an output driver;
    a well bias circuit coupled to the I/O pin, the output driver, and an internal supply voltage; and
    a voltage clamping circuit coupled to the I/O pin, the output driver, and a voltage potential that is substantially lower than the internal supply voltage, said voltage clamping circuit selectively sinking current from the I/O pin to the voltage potential in response to an input from the I/O pin.

13. The I/O circuit of claim 12, wherein the voltage potential is at ground potential.

14. The I/O circuit of claim 13, wherein said voltage clamping circuit comprises a first switch coupled to the I/O pin and to ground potential such that when said first switch is ON, said voltage clamping circuit is enabled to sink current from the I/O pin to ground potential.

15. The I/O circuit of claim 14, wherein said voltage clamping circuit further comprises a second switch coupled to said first switch and the I/O pin.

16. The I/O circuit of claim 15, wherein said voltage clamping circuit further comprises a third switch coupled to said first switch and the I/O pin.

17. The I/O circuit of claim 16, wherein said voltage clamping circuit further comprises a voltage divider coupled to said third switch.

18. The I/O circuit of claim 17, wherein said voltage clamping circuit further comprises a resistor coupled to said first switch and said third switch.

19. The I/O circuit of claim 18, wherein said first switch comprises an n-channel transistor, said second switch comprises an n-channel transistor, and said third switch comprises a p-channel transistor.

20. The I/O circuit of claim 13, wherein said voltage clamping circuit comprises an n-channel transistor which generates current sunk from the I/O pin.

21. The I/O circuit of claim 12, wherein the input from the I/O pin is voltage potential at the I/O pin.

22. The I/O circuit of claim 21 further wherein when the voltage potential at the I/O pin is 1 or more volts greater than the internal voltage supply potential, said voltage clamping circuit selectively sinks more than 20 milliamperes of current from the I/O pin to the voltage potential other than the internal supply voltage.

23. An input/output (I/O) circuit for selectively sinking current from an I/O pin, the I/O circuit comprising:
    an output driver;
    a well bias circuit coupled to the I/O pin, the output driver, and an internal voltage supply; and
    a voltage clamping circuit coupled to the I/O pin, the output driver, and ground potential, wherein said voltage clamping circuit comprises:
        a first switch coupled to said I/O pin and ground potential;
        a second switch coupled to said first switch and the I/O pin;
        a third switch coupled to said first switch and the I/O pin;
        a voltage divider coupled to said third switch; and
        a resistor coupled to said first switch and said third switch;
    further wherein when said first switch, said second switch and said third switch are ON, current is sunk from the I/O pin to ground potential.

24. The I/O circuit of claim 23, wherein said first switch comprises an n-channel transistor, said second switch comprises an n-channel transistor, and said third switch comprises a p-channel transistor.

25. An input/output (I/O) circuit for selectively sinking current from an I/O pin, the I/O circuit comprising:
    an output driver;
    means for biasing said output driver, said means for biasing coupled to the I/O pin, the output driver, and an internal supply voltage; and
    means for sinking current from the I/O pin, said means for sinking current coupled to the I/O pin, the output driver, and a voltage potential that is substantially lower than the internal supply voltage, said means for sinking current selectively sinking current from the I/O pin to the voltage potential in response to an input from the I/O pin.

26. The I/O circuit of claim 25, wherein the input from the I/O pin is voltage potential at the I/O pin.

27. The I/O circuit of claim 26 further wherein when the voltage potential at the I/O pin is 1 or more volts greater than the internal voltage supply potential, said voltage clamping circuit selectively sinks more than 20 milliamperes of current from the I/O pin to the voltage potential other than the internal supply voltage.

28. An integrated circuit (IC) device comprising:
    an I/O pin; and
    an I/O output circuit coupled to said I/O pin for selectively sinking current from said I/O pin, said I/O pin comprising:
        an output driver;
        a well bias circuit coupled to said I/O pin, said output driver, and an internal supply voltage; and a voltage clamping circuit coupled to said I/O pin, said output driver, and a voltage potential that is substantially lower than the internal supply voltage, said voltage clamping circuit selectively sinking current from said I/O pin to the voltage potential in response to an input from the I/O pin.

29. The IC device of claim 28, wherein the voltage potential is at ground potential.

30. The IC device of claim 29, wherein said voltage clamping circuit comprises a first switch coupled to said I/O pin and to ground potential such that when said first switch is ON, said voltage clamping circuit is enabled to sink current from the I/O pin to ground potential.

31. The IC device of claim 30, wherein said voltage clamping circuit further comprises:

a second switch coupled to said first switch and said I/O pin;

a third switch coupled to said first switch and said I/O pin;

a voltage divider coupled to said third switch; and a resistor coupled to said first switch and said third switch.

32. The IC device of claim 31, wherein said first switch comprises an n-channel transistor, said second switch comprises an n-channel transistor, and said third switch comprises a p-channel transistor.

33. The IC device of claim 28, wherein said voltage clamping circuit comprises an n-channel transistor which generates current sunk from said I/O pin.

34. The IC device of claim 28, wherein the input from the I/O pin is voltage potential at the I/O pin.

35. The IC device of claim 34 further wherein when the voltage potential at the I/O pin is 1 or more volts greater than the internal voltage supply potential, said voltage clamping circuit selectively sinks more than 20 milliamperes of current from the I/O pin to the voltage potential other than the internal supply voltage.

36. An input/output (I/O) circuit for selectively sinking current from an I/O pin, the I/O circuit comprising:

an output driver including a pull-up driver and a pull-down driver;

a well bias circuit coupled to the I/O pin, the output driver, and an internal supply voltage; and a voltage clamping circuit coupled to the I/O pin and the output driver, said voltage clamping circuit selectively sinking current from the I/O pin to ground potential, wherein said voltage clamping circuit comprises a first switch coupled to the I/O pin and to ground potential such that when said first switch is ON, said voltage clamping circuit is enabled to sink current from the I/O pin to ground potential, further wherein said voltage clamping circuit comprises a second switch and a third switch coupled to said first switch and the I/O pin, further wherein said voltage clamping circuit comprises a voltage divider coupled to said third switch.

37. The I/O circuit of claim 36, wherein said first switch comprises an n-channel transistor which generates current sunk from the I/O pin.

38. The I/O circuit of claim 36, wherein said voltage clamping circuit further comprises a resistor coupled to said first switch and said third switch.

39. The I/O circuit of claim 38, wherein said first switch comprises an n-channel transistor, said second switch comprises an n-channel transistor, and said third switch comprises a p-channel transistor.

* * * * *